INVENTOR.
JACQUES R. BEAUDOUIN
BY
Arthur L. Lessler
ATTORNEY

INVENTOR.
JACQUES R. BEAUDOUIN
BY Arthur L. Lessler
ATTORNEY

United States Patent Office 3,419,763

Patented Dec. 31, 1968

3,419,763

HIGH POWER TRANSISTOR STRUCTURE

Jacques Raymond Beaudouin, Palo Alto, Calif., assignor to International Telephone and Telegraph Corporation, a corporation of Delaware Filed Oct. 31, 1966, Ser. No. 590,621
9 Claims. (Cl. 317—234)

ABSTRACT OF THE DISCLOSURE

The subject matter of this invention is a support for high power semiconductor devices employing a mounting arrangement which introduces as little thermal and electrical resistance as possible between the semiconductor element proper and the external device connections.

This invention relates to the packaging of semiconductors, and more particularly to a novel structure suitable for housing high power semiconductor devices.

In the manufacture of high power semiconductor devices, especially transistors, it is desirable to employ a mounting arrangement which introduces as little thermal and electrical resistance as possible between the semiconductor element proper and the external device connections.

In addition, since the larger the size of a monolithic semiconductor element, the lower the manufacturing yield, it is often desirable to construct a device of given power rating by employing a number of smaller semiconductor elements in parallel as opposed to the utilization of a single large element of equivalent rating. In such a case, it is advantageous to employ a packaging arrangement such that at some intermediate manufacturing stage, the parallel-connected semiconductor elements may be tested and, if defective replaced; this alleviates the necessity for throwing away the entire structure in the event only one element thereof is unsatisfactory.

Accordingly, an object of the present invention is to provide an improved mounting structure for high semiconductor devices.

Another object of the invention is to provide a semiconductor mounting structure having low thermal and electrical series resistance between the active elements thereof and the external connections thereto.

Another object of the invention is to provide a semiconductor mounting structure having a relatively large area for parallel mounting of a plurality of active semiconductor elements.

These, and other objects which will become apparent by reference to the following detailed description taken in conjunction with the accompanying drawings and appended claims, are realized by employing a novel disc-shaped subassembly for mounting of the active semiconductor elements, and employing said subassembly during the intermediate fabrication and testing steps involved in assembling the semiconductor device.

Figures 1, 2A, 2B, 3A, 3B:
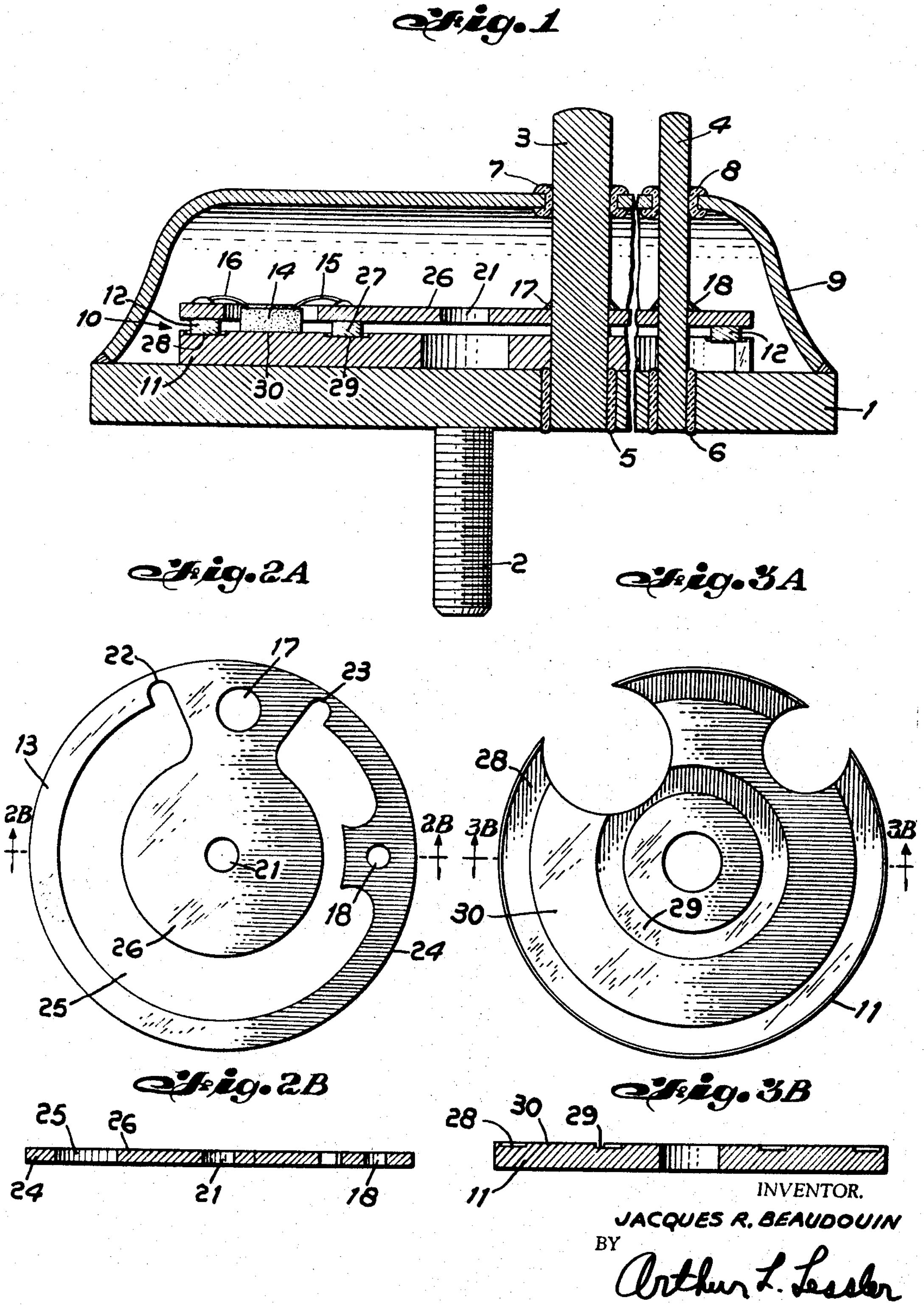
FIG. 1 shows a staggered sectional view of an assembled high power semiconductor device according to a preferred embodiment of the invention.
FIGS. 2A, 2B and 3A, 3B show the major components employed for fabrication of the novel subassembly according to the preferred embodiment.

In FIG. 1, the disc shaped subassembly 10 is supported by and soldered to a stud type header 1. The header 1 may preferably comprise a material of good electrical and thermal conductivity such as copper, and has a large threaded stud 2 extending therefrom. The stud 2 is employed for making mechanical and electrical connection to a suitable mounting structure which may, e.g., comprise a heat sink of suitable capacity. The stud 2 is also useful for holding the header 1 in a desired position during intermediate fabrication steps.

Secured to the header 1 and insulated therefrom by glass seals 5 and 6 are terminal leads 3 and 4 respectively. These terminals leads also extend through corresponding apertures in the top of the housing 9 and are insulated from the housing by metallized ceramic seals 7 and 8.

The disc-shaped subassembly 10 comprises a lower metallic disc 11 having an outer groove 28 and an inner groove 29 in the upper surface thereof with an annular area 30 therebetween. Disposed in each of said grooves is a first insulating layer 12 and a second insulating layer 27. The insulating layers may preferably comprise a plurality of ceramic spacers having the opposed surfaces thereof metallized and subsequently gold plated. One gold plated surface of each spacer is soldered to the bottom of the corresponding groove 28 or 29 of lower disc 11. Soldered to the upper surface of the spacers 12 disposed in outer groove 28 is a peripheral metallic ring 13. Soldered to the upper surfaces of the spacers 27 disposed in the inner groove 29 is a central metallic disc 26. The peripheral ring 13 has an aperture 18 therein through which terminal lead 4 protrudes. Terminal lead 4 is soldered to peripheral ring 13 at the aperture 18. Similarly, the central metallic disc 26 has an aperture 17 therein through which terminal lead 3 protrudes; terminal lead 3 is soldered to the central metallic disc 26 at the aperture 17.

The lower disc 11 has oversized apertures therein through which the terminal leads 3 and 4 extend, so that said leads remain electrically insulated from the header 1 and the lower disc 11.

Mounted to the subassembly 10 are a plurality of active semiconductor elements 14. These elements are transistors of the interdigitated type shown generally in FIG. 5 of U.S. Pat. No. 2,924,760 and FIGS. 6 and 7 of U.S. Pat. No. 3,234,441. Each of the interdigitated transistor elements 14 has a collector electrode on the bottom surface thereof and a plurality of interdigitated base and emitter electrodes on the upper surface thereof. Each transistor 14 is mounted on the annular area 30 of lower disc 11 by soldering the bottom of said element to said annular area, thereby simultaneously forming an electrical and thermal connection between the collector electrode of each transistor and the lower disc 11 and underlying header 1. The emitter contacts on the upper surface of each transistor 14 are electrically connected to central metallic disc 26 by interconnecting wires 15, so that terminal lead 3 serves as the emitter lead of the composite structure. Similarly, the base contacts on the upper surface of each transistor 14 are electrically connected to the peripheral metallic ring 13 by interconnecting wires 16, so that the terminal lead 4 serves as the base lead of the composite structure. The central aperture 21 of the subassembly 10 is employed for jigging purposes during certain intermediate fabrication steps.

Broadly speaking, the fabrication of the novel structure shown in FIG. 1 consists of the following major operations:

(A) Fabrication of the subassembly 10;

(B) Mounting the transistors 14 to the subassembly 10;

(C) Testing the mounted transistors 14 and replacing any defective units;

(D) Placing the subassembly 10 on the header 1, alignment being insured by header terminal leads 3 and 4 in conjunction with subassembly apertures 17 and 18, and soldering the subassembly to the header; and (E) Installing the housing 9, and bonding the housing to the header 1 and to terminal leads 3 and 4 at respective insulating seals 7 and 8.

The steps employed in fabricating the subassembly 10 will be understood by reference to FIGS. 2A, 2B, 3A, 3B and 5. FIGS. 2A and 2B show the copper piece part utilized to form the base and emitter contact rings, while FIG. 3 shows the copper piece part employed as the lower disc 11.

The lower disc 11 shown in FIG. 3 is mounted to the upper piece part of FIG. 2A to form a sandwich structure, by the following method. A plurality of solder preforms (thin wafers of solder having dimensions substantially equal to those of the ceramic spacers to be placed thereon) are placed in the grooves 28 and 29 of lower disc 11. It is important to insure that no solder pre-forms are placed in the areas of outer groove 28 which will underlie web portions 22 and 23 of the upper piece part 24 when said upper piece part is subsequently placed adjacent the lower disc 11.

The next step is to place a ceramic spacer, which has been metallized and subsequently gold plated, on each solder pre-form disposed in the grooves 28 and 29. An additional solder pre-form is then placed on the upper surface of each metallized and gold plated ceramic spacer. Before placing the solder pre-forms and overlying ceramic spacers in the grooves 28 and 29, it is preferable to place the lower disc 11 on the carbon centering jig 31 shown in FIG. 5, so that the oversized holes of the lower disc are aligned with the pegs of the carbon centering jig 31.

After the various components of the subassembly 10 have been assembled on the carbon centering jig 31 as described above, the upper piece part 24 being properly aligned by aligning the apertures 17 and 18 therein with corresponding pegs of the carbon centering jig, a stainless steel weight 32 having apertures therein aligned with the pegs of the carbon centering jig 31 and with the apertures 17 and 18 of the upper piece part 24, is placed atop the subassembly 10 in order to press the various components thereof together. Preferably, the stainless steel weight 32 should weigh about 50–60 grams.

Figures 4, 5, 6:
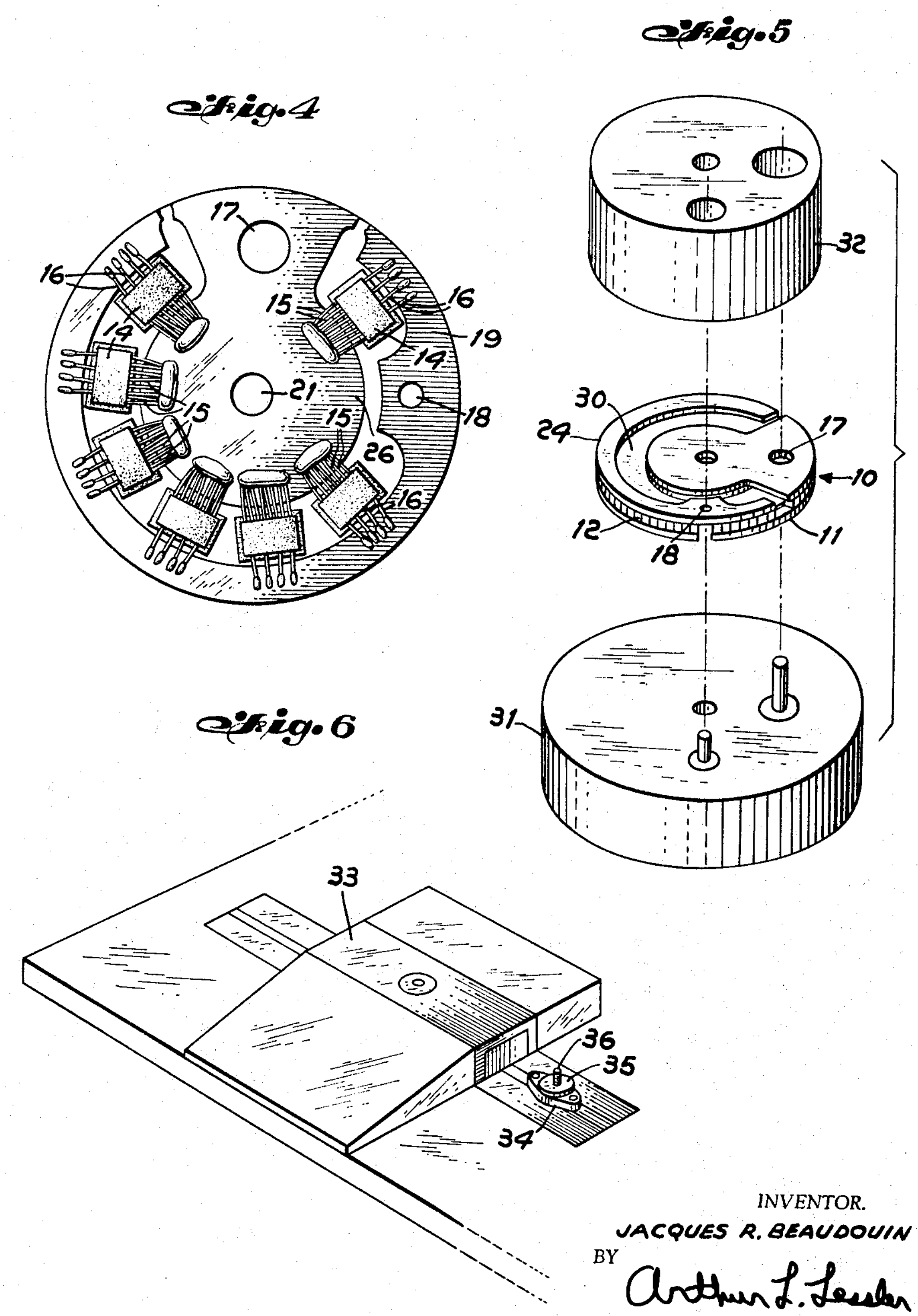
FIG. 4 shows the completed subassembly having a plurality of parallel connected active semiconductor elements mounted thereon.
FIG. 5 shows an intermediate step in fabrication of the subassembly.
FIG. 6 shows apparatus used for securing the active semiconductor elements to the subassembly.

The entire assembly, as shown in FIG. 5, is then passed through a belt type furnace having a hot zone above the melting point of the solder pre-forms, in order to bond together the upper piece part 24, the ceramic spacers 12 and 27, and the lower disc 11. After removal of the subassembly 10 from the furnace, the web portions 22 and 23 of upper piece part 24 are removed to isolate the peripheral metallic ring 13 from the central metallic disc 26. The subassembly 10 is subsequently cleaned and gold plated, and tested for possible electrical short circuits between the three isolated parts 11, 13 and 26.

The individual transistor elements to be mounted on the annular area 30 of subassembly lower disc 11 are fabricated as interdigitated structures having interleaved base and emitter contacts on the upper surface thereof, the lower surfaces of said transistors serving as their collector electrodes. After each transistor has been fabricated and tested in accordance with well known semiconductor techniques, it is soldered to a molybdenum plate having dimensions comparable to those of the transistor 14. The other side of each molybdenum plate, after the corresponding transistor 14 has been soldered thereto, is coated with solder by rubbing the plate on a heated surface covered with a thin layer of molten solder.

The apparatus shown in FIG. 6 is now employed in order to facilitate soldering of the molybdenum mounted transistors 14 to the annular area 30 of subassembly lower disc 11. Shown in FIG. 6 is a table top furnace 33 and a soldering jig comprising a base 34 and an overlying carbon disc 35 having a central aperture therein through which a peg 36 protrudes. The subassembly 10 is placed on the carbon disc 35 so that the peg 36 extends through the aperture 21 of the subassembly. The jig 34, with the subassembly 10 situated thereon, is then placed in the table top furnace 33 and heated to a temperature substantially below the melting temperature of the solder pre-forms previously employed to bond the component parts of subassembly 10 together but above the melting point of the solder covering the outer surface of the molybdenum mounting plates of the transistors 14. A solder stick is employed to rub a thin layer of molten solder on the exposed annular area 30 of subassembly lower disc 11.

The transistors 14 are then placed on the annular area 30 so that the pre-soldered molybdenum plates thereof become bonded to said annular area. The subassembly 10 is then moved into the cold zone of the table top furnace and allowed to cool. It is preferable to cover the major portion of the upper surface of each transistor 14 with a suitable protective insulating material, such as silicon rubber, prior to securing said transistor to its molybdenum plate, in order to allevitae the possibility of short circuits developing due to minute solder splashes on said upper surface during subsequent processing steps.

Next, gold wires are bonded between the emitter and base contacts of each transistor 14 and central metallic disc 26 and peripheral metallic ring 13 respectively. Alternatively, it is desirable to bond the gold wires 15 and 16 to the emitter and base contacts of each transistor 14 after the transistor has been mounted on its molybdenum plate and before it has been soldered to annular area 30. If this is done, the silicon rubber protective layer may cover the entire upper semiconductor surface.

The resultant subassembly, with the finished transistors 14 secured thereto, is shown in FIG. 4.

The completed subassembly 10 is then placed upon the stud type header 1 shown in FIG. 1, the apertures 17 and 18 of the subassembly aligning with the terminal posts 3 and 4. Prior to being placed upon the header, the top surface of the header and the bottom of the subassembly are pre-tinned with solder. After the subassembly is placed on the header, the structure is heated to bond the two together. At this point, the terminal leads 3 and 4 are also soldered to the central metallic disc 26 and the peripheral metallic ring 13 respectively.

As this stage the device is electrically tested. In the event that the device proves defective, the subassembly 10 may be unsoldered from the header 1 and terminal leads 3 and 4 and replaced with a good unit. Replacement of the subassembly is desirable in view of the relatively high cost of the stud type header 1. After removal of a defective subassembly, each individual transistor 14 thereof may be electrically disconnected therefrom and tested, it thus being possible to repair defective subassemblies. An additional advantage is that the yield obtainable in manufacturing a monolithic transistor having an area equal to the combined areas of the transistor elements 14 would be substantially lower than the yield realizable in fabricating the smaller individual elements 14. Thus the device according to my invention may be assembled with a substantially greater manufacturing yield than single monolithic structures heretofore employed. The high thermal conductivity between each transistor element 14 and the header 1 guarantees low thermal resistance and consequently higher power dissipation capability, as well as insuring that no unbalances result due to temperature differentials between the various transistor elements 14.

The tested device is capped by the housing 9 and sealed in a suitable controlled atmosphere. The base and emitter pins 4 and 3 respectively are allowed to protrude through the housing 9 by insulated tubes 8 and 7 therein. The terminal leads are soldered to these insulated tubes to complete the seal.

While the principles of the invention have been described above in connection with specific embodiments, and particular modifications thereof, it is to be clearly understood that this description is made only by way of example and not as a limitation on the scope of the invention.

I claim:

1. A semiconductor device, comprising:
- a header of good thermal conductivity;
- a plurality of terminal leads secured to and electrically insulated from said header;
- a subassembly mounted on and thermally coupled to said header, said subassembly having a major surface electrically insulated from said header, said major surface having apertures therein through which said terminal leads protrude, said leads being electrically connected to adjacent conductive areas of said major surface at said apertures; said major surface comprises a central part and a peripheral part, said parts being electrically insulated from each other, one aperture being disposed in said central part and a second aperture disposed in said peripheral part;
- an active semiconductor element mounted on said subassembly, said element having first and second electrodes thereon, said element being situated in a section of said subassembly disposed between said central and peripheral parts; and
- means for electrically connecting said first and second electrodes to said adjacent conductive areas of said major surface.

2. A device according to claim 1, further comprising a plurality of active semiconductor elements mounted on said subassembly, each of said elements having a first electrode electrically connected to said adjacent conductive area and a second electrode electrically connceted to said adjacent conductive region.

3. A semiconductor device according to claim 1 wherein said subassembly has an annular shape.

4. A device according to claim 3, wherein each said element comprises a semiconductor wafer having at least two active regions contiguous with a given major surface thereof, each said active region being contacted by a corresponding one of said first and second electrodes, said wafer having a third active region contiguous with the other major surface thereof, said annular section having a conductive surface electrically insulated from said major surface of said subassembly, and means for securing said wafer to said conductive surface to form a joint of good electrical and thermal conductivity between said third active region and said conductive surface.

5. A device according to claim 4, wherein said elements are transistors, said first, second and third active regions being the emitter, base and collector regions of said transistors respectively.

6. A device according to claim 5, wherein said subassembly is of laminated construction comprising:
- a lower metallic disk having one surface bonded to said header, said lower disk having an annular conductive area on the other surface thereof for receiving said transistors;
- a first insulating layer disposed on said other surface surrounded by said annular area;
- a second insulating layer disposed on said other surface surrounding said annular area;
- a central metallic disk disposed on said first insulating layer; and
- a peripheral metallic ring disposed on said second insulating layer.

7. A device according to claim 6, wherein said terminal leads extend through apertures in said lower disk, the diameters of said apertures being larger than the diameters of the corresponding terminal leads.

8. A device according to claim 7, wherein said subassembly has a central alignment hole through the major surfaces thereof.

9. A device according to claim 7, further comprising a mounting stud secured to said header and a housing bonded to said header and enclosing said subassembly.

References Cited

UNITED STATES PATENTS

| | | | |
|---|---|---|---|
| 2,887,628 | 5/1959 | Zierdt | 317—234 |
| 3,021,461 | 2/1962 | Oakes et al. | 317—234 |
| 3,092,893 | 6/1963 | Cornelison et al. | 29—25.3 |
| 3,159,775 | 12/1964 | Ingraham | 29—589 |
| 3,171,187 | 3/1965 | Ikeda et al. | 29—25.3 |
| 3,226,798 | 1/1966 | Wolff | 29—25.3 |
| 3,281,628 | 10/1966 | Bauer et al. | 317—234 |
| 3,311,798 | 3/1967 | Gray | 317—234 |
| 3,325,704 | 6/1967 | Belasco et al. | 317—234 |

JOHN W. HUCKERT, *Primary Examiner.*

R. F. POLISSACK, *Assistant Examiner.*

U.S. Cl. X.R.

29—589, 591; 174—50.6, 50.61; 317—235